United States Patent
Hazeghi

(10) Patent No.: US 10,122,146 B2
(45) Date of Patent: Nov. 6, 2018

(54) THIN LASER PACKAGE FOR OPTICAL APPLICATIONS

(71) Applicant: Aquifi, Inc., Palo Alto, CA (US)

(72) Inventor: Aryan Hazeghi, Palo Alto, CA (US)

(73) Assignee: Aquifi, Inc., Palo Alto, CA (US)

( * ) Notice: Subject to any disclaimer, the term of this patent is extended or adjusted under 35 U.S.C. 154(b) by 0 days.

(21) Appl. No.: 15/480,159

(22) Filed: Apr. 5, 2017

(65) Prior Publication Data

US 2017/0288366 A1  Oct. 5, 2017

Related U.S. Application Data

(60) Provisional application No. 62/318,691, filed on Apr. 5, 2016.

(51) Int. Cl.
| | | |
|---|---|---|
| *H01S 5/00* | (2006.01) | |
| *H01S 5/022* | (2006.01) | |
| *G02B 27/42* | (2006.01) | |
| *G06T 7/521* | (2017.01) | |

(52) U.S. Cl.
CPC ........ *H01S 5/0071* (2013.01); *G02B 27/4233* (2013.01); *H01S 5/02236* (2013.01); *G06T 7/521* (2017.01)

(58) Field of Classification Search
CPC .... G02B 27/18; G02B 27/20; G02B 27/4233; H01S 5/0071; H01S 5/02236; G01B 11/22; G06T 7/521
See application file for complete search history.

(56) References Cited

U.S. PATENT DOCUMENTS

| | | | | |
|---|---|---|---|---|
| 4,191,456 | A * | 3/1980 | Hong | ............ H04N 9/3105 348/751 |
| 4,881,237 | A * | 11/1989 | Donnelly | ............ H01S 5/18 372/34 |
| 9,116,421 | B1 | 8/2015 | Rutherford | |
| 9,503,708 | B2 | 11/2016 | Hazeghi et al. | |
| 2004/0130799 | A1 | 7/2004 | Kreitzer | |
| 2005/0105061 | A1 | 5/2005 | DeLong | |
| 2010/0284082 | A1 | 11/2010 | Shpunt et al. | |

(Continued)

OTHER PUBLICATIONS

International Search Report and Written Opinion for corresponding PCT Application No. PCT/US17/26197, dated Jun. 21, 2017 (10 pages).

*Primary Examiner* — Kimberly N. Kakalec

(74) *Attorney, Agent, or Firm* — Lewis Roca Rothgerber Christie LLP

(57) ABSTRACT

An optical projection system includes: a laser emitter configured to emit a beam along an emission axis; an optical element having an optical axis non-parallel to the emission axis, the optical element having a back focal length; and a folding optic configured to redirect the beam toward the optical axis, the beam following a folded optical path having: a first section along the emission axis from the laser emitter to the folding optic; and a second section along the optical axis from the folding optic to the optical element, the sum of the lengths of the first and second sections being equal to the back focal length, the length of the first section being a function of a divergence of the beam and the back focal length, and the folding optic having a height along the optical axis configured to redirect substantially the entire beam emitted by the laser emitter.

20 Claims, 8 Drawing Sheets

(56) References Cited

U.S. PATENT DOCUMENTS

| | | | |
|---|---|---|---|
| 2011/0164640 A1* | 7/2011 | Shimada | H01S 5/4031 372/45.011 |
| 2011/0187878 A1* | 8/2011 | Mor | G02B 27/0983 348/218.1 |
| 2012/0038918 A1* | 2/2012 | Liu | B29D 11/00269 356/328 |
| 2012/0038986 A1* | 2/2012 | Pesach | G01S 17/74 359/572 |
| 2013/0182441 A1* | 7/2013 | Nemeyer | F21L 4/005 362/277 |
| 2013/0235609 A1* | 9/2013 | Nemeyer | F21V 13/02 362/553 |
| 2016/0127714 A1 | 5/2016 | Hazeghi et al. | |

* cited by examiner

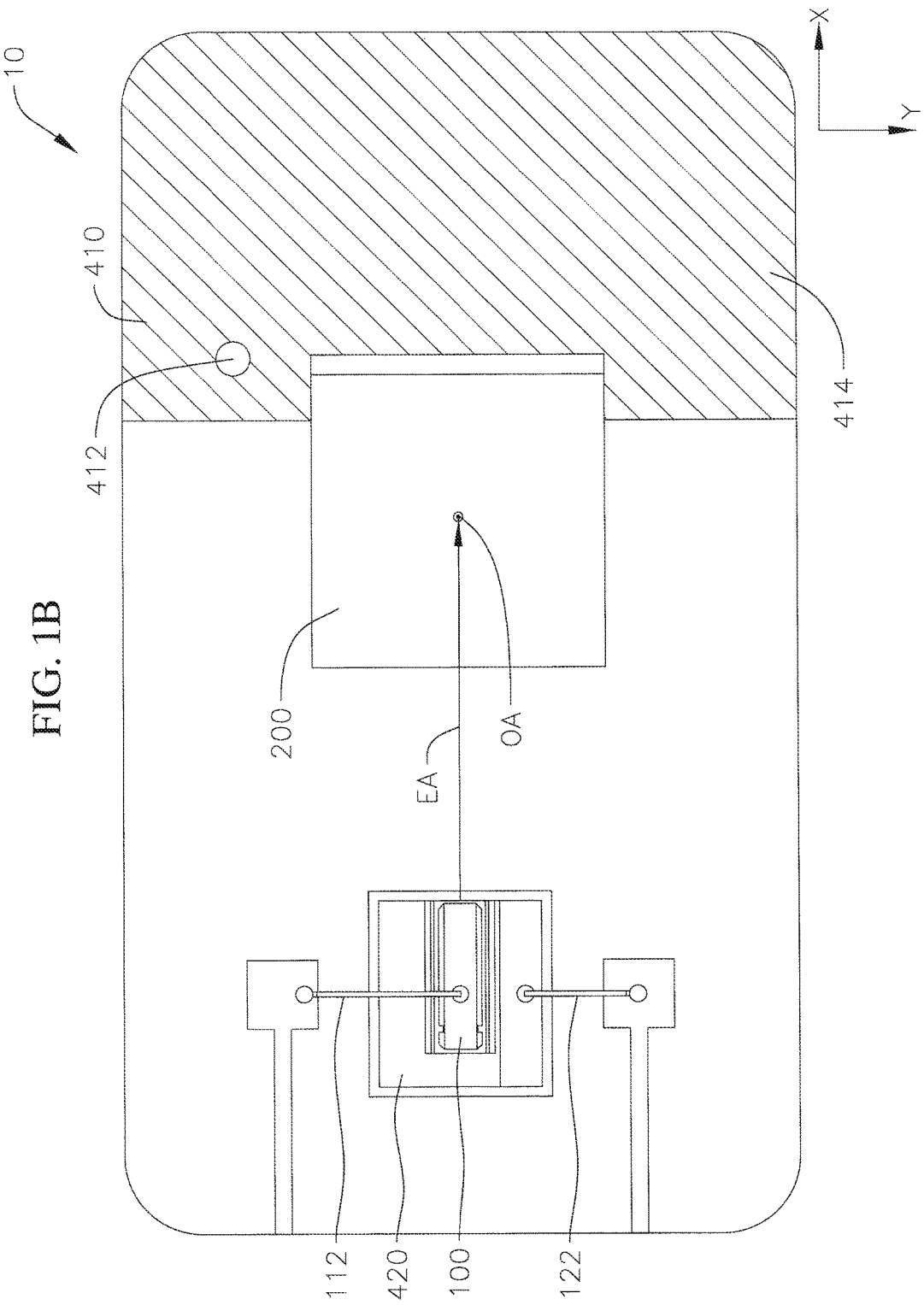

THIN LASER PACKAGE FOR OPTICAL APPLICATIONS

CROSS-REFERENCE TO RELATED APPLICATION(S)

This application claims the benefit of U.S. Provisional Patent Application No. 62/318,691, filed in the United States Patent and Trademark Office on Apr. 5, 2016, the entire disclosure of which is incorporated by reference herein.

FIELD

Aspects of embodiments of the present invention relate to a laser package for optical applications.

BACKGROUND

Lasers are commonly used in consumer, commercial, and industrial contexts for a variety of optical applications such as providing diffuse lighting or pattern projection. As such, lasers can be integrated into host devices to support these applications. One such application for lasers is in active type depth camera systems, where a laser projection source can provide supplemental illumination to assist in capturing accurate depth maps.

In some application contexts, the size and shape of a host device can impose constraints on the form factor of the laser. For example, in the case of mobile devices such as smartphones, market pressure to create thinner and smaller phones may place constraints on the thickness of a laser package along the direction in which laser light is emitted (e.g., its optical axis).

SUMMARY

Aspects of embodiments of the present invention relate to a thin laser system for optical applications.

According to one embodiment of the present invention, an optical projection system includes: a laser emitter configured to emit a beam of light along an emission axis, the beam having a divergence; an optical element having an optical axis, the optical axis being non-parallel to the emission axis, the optical element having a back focal length; and a folding optic configured to redirect the beam emitted by the laser emitter toward the optical axis of the optical element, the beam following a folded optical path having: a first section extending along the emission axis from the laser emitter to the folding optic; and a second section extending along the optical axis from the folding optic to the optical element, the sum of the lengths of the first and second sections being equal to the back focal length, the length of the first section being a function of the divergence of the beam and the back focal length of the optical element, and the folding optic having a height along the optical axis configured to redirect substantially the entire beam emitted by the laser emitter.

A thickness of the optical projection system along the optical axis may be independent of optical characteristics of the optical element.

The thickness of the optical projection system may be less than 3 mm.

The divergence may be in a range of 16 degrees to 20 degrees, and the back focal length may be in a range of 3 mm to 5 mm.

The laser emitter may be mounted on a submount, the submount raising a height of laser emitter along a direction of the optical axis, and an active area of the laser emitter may face submount.

The emission axis may be perpendicular to the optical axis.

The folding optic may be a mirror.

The folding optic may be a prism.

The optical element may include a diffractive optical element.

The diffractive optical element may be configured to perform a collimation function.

The diffractive optical element may be configured to perform a collimation function and a patterning function.

The optical element may include a light diffuser.

The optical element may include a refractive lens.

The laser emitter and the folding optic may be mounted on a substrate, the substrate having an airflow port in an optically inactive region of the substrate.

According to one embodiment of the present invention, an optical projection system is configured to emit light along an optical axis toward an optical element at a configured location, the optical element having a back focal length and being aligned with the optical axis, the optical projection system including: a laser emitter configured to emit a beam of light along an emission axis, the beam having a divergence; the emission axis being non-parallel to the optical axis; and a folding optic configured to redirect the beam emitted by the laser emitter toward the optical axis, the optical projection system being configured to transmit the beam along a folded optical path having: a first section extending along the emission axis from the laser emitter to the folding optic; and a second section extending along the optical axis from the folding optic to the configured location of the optical element, the sum of the lengths of the first and second sections being equal to the back focal length, the length of the first section being a function of the divergence of the beam and the back focal length of the optical element, and the folding optic having a height along the optical axis configured to redirect substantially the entire beam emitted by the laser emitter.

A thickness of the optical projection system along the optical axis, from the folding optic to the configured location, may be independent of optical characteristics of the optical element.

The thickness of the optical projection system, from the folding optic to the configured location, may be less than 3 mm.

The divergence may be in a range of 16 degrees to 20 degrees, and the back focal length may be in a range of 3 mm to 5 mm.

The optical element may include a diffractive optical element.

The diffractive optical element may be configured to perform a collimation function.

BRIEF DESCRIPTION OF THE DRAWINGS

The accompanying drawings, together with the specification, illustrate exemplary embodiments of the present invention, and, together with the description, serve to explain the principles of the present invention.

FIGS. 1B and 1C are top and cut-away side views of the laser system of the embodiment shown in FIG. 1A.

DETAILED DESCRIPTION

Figure 1A:
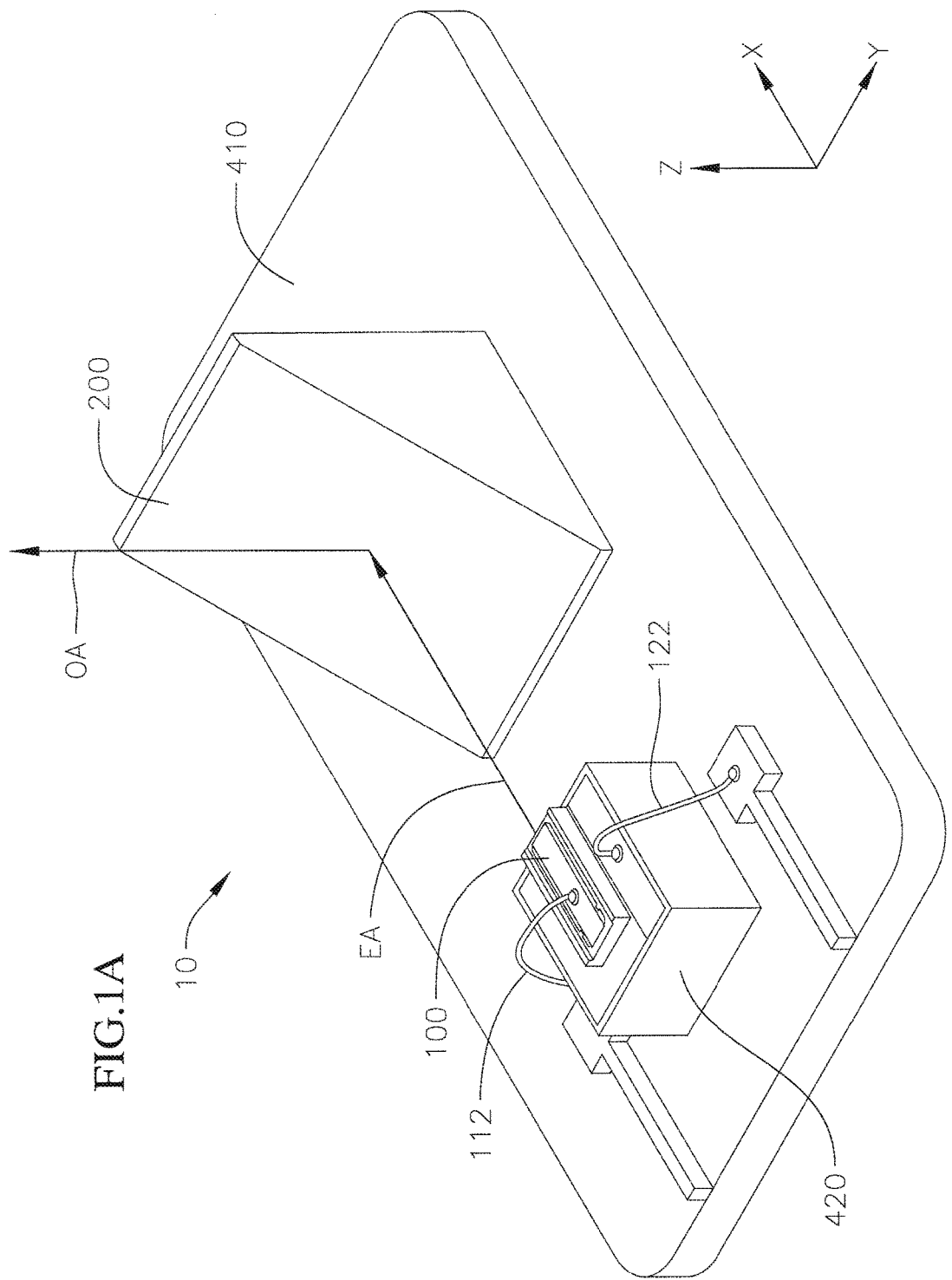
FIG. 1A is a perspective view of a laser system in a package according to one embodiment of the present invention.

Aspects of embodiments of the present invention relate to packages for reduced height laser systems that can be used for optical applications such as providing diffuse lighting or pattern projection. In one embodiment, a laser system includes an infra-red (IR) laser and has applications for building thin projection systems for depth cameras that capture 3D images of a scene in different lighting conditions (e.g., different levels of ambient light). Such depth cameras can be incorporated in various mobile or stationary devices just like typical color cameras that have a very slim thickness profile.

Generally, depth camera systems capture a scene and estimate the depth (or "z-distance") of each pixel in a scene, thereby generating a "depth map." Depth camera systems (or more simply "depth cameras") can be broadly classified into passive depth cameras and active type depth cameras.

Active type depth cameras typically include an illumination component which emits light onto a scene. Types of active depth cameras include "time-of-flight" active depth cameras, which emit diffuse modulated illumination onto the scene, and "structured light" active depth cameras, which emit a collimated illumination pattern. This additional illumination allows the capture of depth images in low light conditions, in much the way that a camera flash provides additional light when capturing a standard two dimensional image. Furthermore, emitting patterned light onto a scene can improve the quality of the resulting depth maps, even when there is ample ambient light in the scene, by providing additional texture that can be detected during a stereo matching process when generating the depth maps.

Generally, an active depth camera includes an active illumination component, an image acquisition component, and a processing component, where the processing component implements a depth estimation algorithm. The image acquisition component may include multiple two-dimensional (2D) cameras that are spaced apart and rigidly attached to a frame. The illumination system illuminates the scene with diffuse or collimated light, which can be constant over time, pulsed, or modulated. The illumination may be concentrated in a single wavelength or span a range of wavelengths, and the illumination may be in an invisible portion of the electromagnetic spectrum, such as the infra-red range. The active illumination component and the image acquisition component may be mounted together on a substrate such as a printed circuit board, and the active illumination component may be arranged to have an optical axis that is substantially parallel to the optical axis (or optical axes) of the cameras of the image acquisition component.

In many circumstances, the thickness of the projection source along its optical axis (e.g., along the emission direction of the laser or z-direction) is a limiting factor when attempting to reduce or minimize the overall thickness of a system that incorporates the projection source. For example, in an active depth camera system that includes a laser projection source and multiple image sensors and lenses, a typical laser projection source is often the thickest part of the system.

The overall thickness of a laser projection system can be an issue in some contexts, such as the consumer portable computing device market, in which there is currently substantial market pressure to create smaller and thinner devices (e.g., smartphones). In many circumstances, the optical axis of the laser projection system is parallel to the thickness direction of the device (e.g., perpendicular to the display of the smartphone, such as in the flash of a smartphone camera), rather than parallel to the plane of the device (e.g., parallel to the display of the device, such as in a television remote control).

As such, embodiments of the present invention are directed to a laser system having a package that is thin along the direction in which it emits light (its optical axis). In some embodiments, the dimensions of the package depend on the emission characteristics of the laser diode, including the beam divergence, and the dimensions of the package are independent of optical characteristics of the optical elements that modify the beam, such as collimation wavelength (if a collimating optical element is present), projection angles, projection fan-out, and the like.

At least one design for a laser package having reduced thickness is described in, for example, U.S. Pat. No. 9,503,708 "Systems and Methods for Reducing Z-Thickness and Zero-Order Effects in Depth Cameras," issued on Nov. 22, 2016, the entire disclosure of which is incorporated by reference.

Figure 1C:
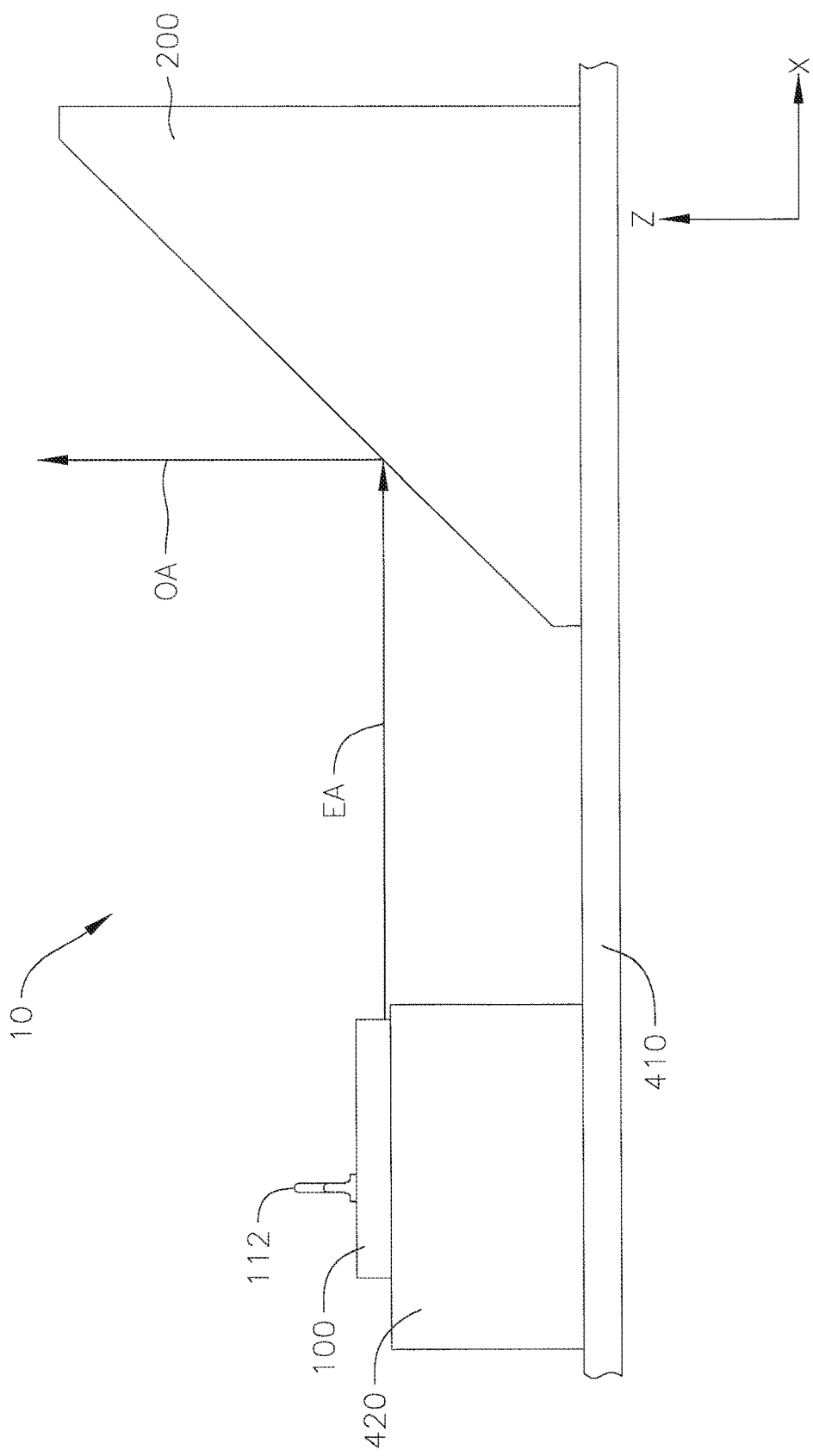
Figure 1D:
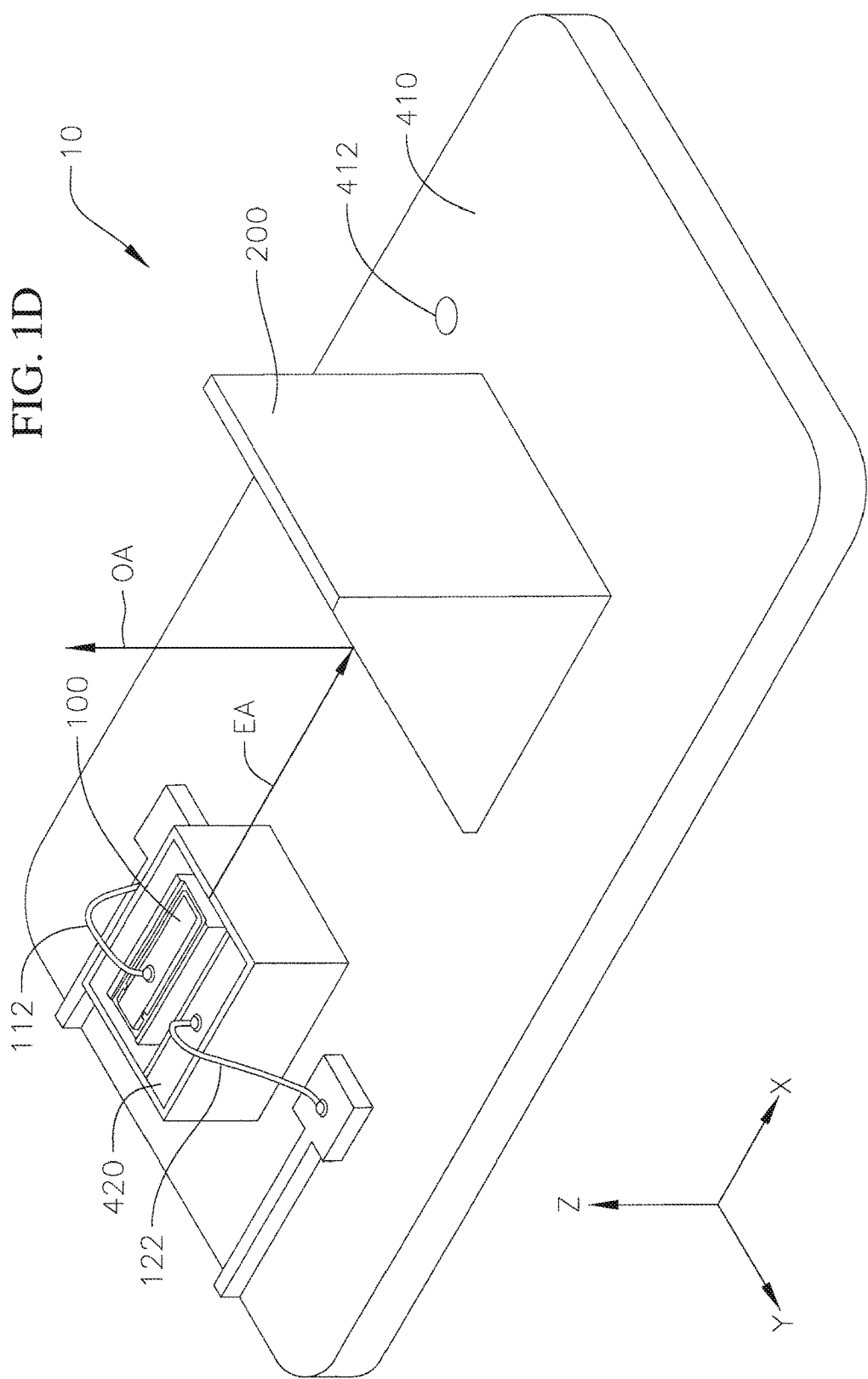
FIG. 1D is an alternate perspective view of the laser system of the embodiment shown in FIG. 1A.
Figure 1E:
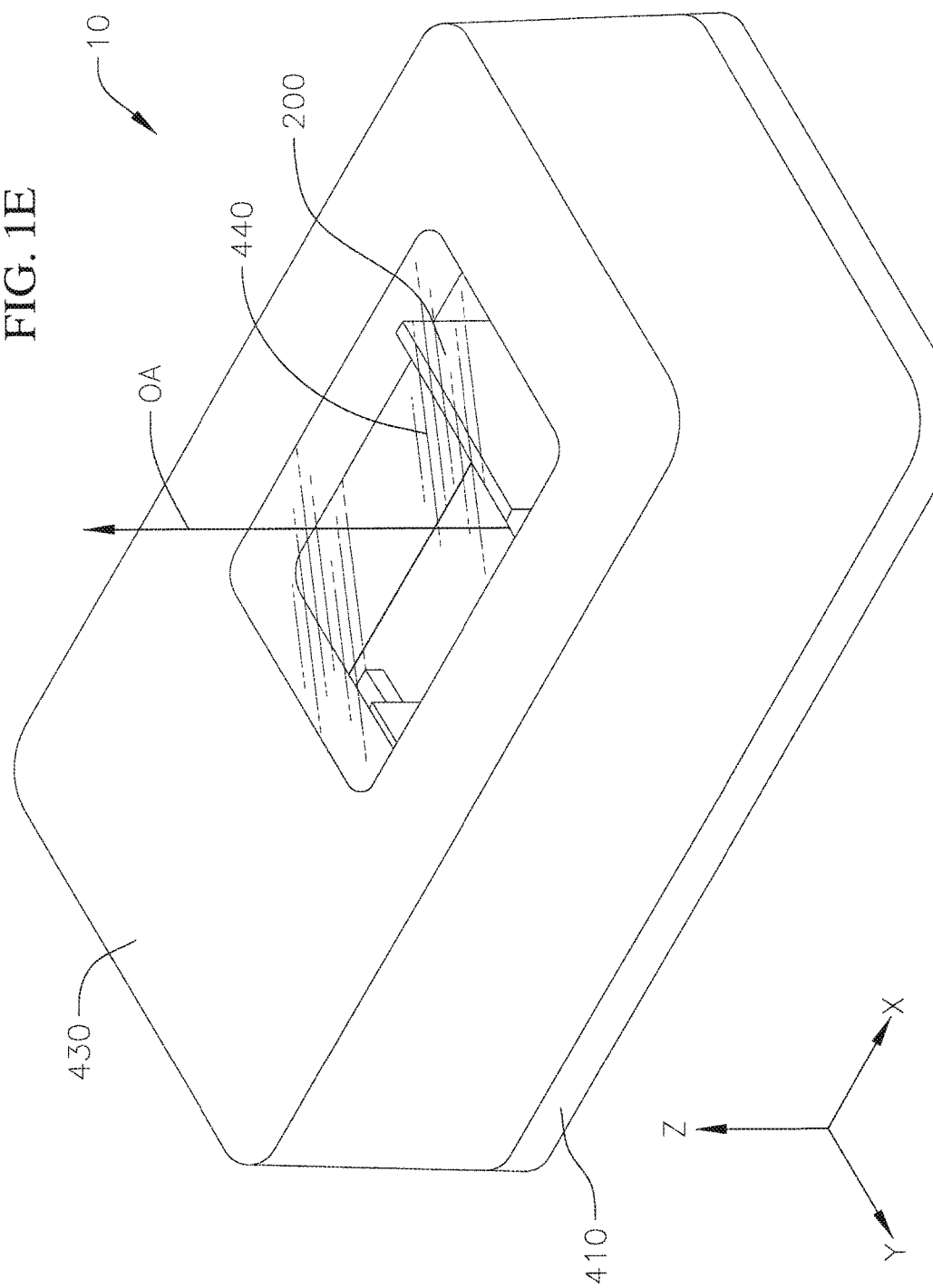
FIG. 1E is a perspective view of the laser system of the embodiment of FIG. 1A that is enclosed by a package.

FIG. 1A is a perspective view of a laser system 10 in a package according to one embodiment of the present invention. FIGS. 1B and 1C are top and cut-away side views of the laser system of the embodiment shown in FIG. 1A. FIG. 1D is an alternate perspective view of the laser system of the embodiment shown in FIG. 1A. FIG. 1E is a perspective view of the laser system of the embodiment of FIG. 1A that is enclosed by a package.

As shown in FIGS. 1A, 1B, 1C, 1D, and 1E, the laser system 10 includes a laser emitter 100 and a folding optic 200. The laser emitter 100 may be laser diode having p- and n-type layers connected (e.g., wire bonded) to leads 112 and 122, respectively, that are connected to electrical contacts which supply power from an external source. As such, the laser emitter 100 can be turned on (e.g., controlled to emit light) by supplying electrical power to the electrical contacts (e.g., supplying a voltage across the electrical contacts). In one embodiment, the laser emitter 100 is an edge-emitting (or in-plane) semiconductor laser configured to emit light along an emission axis EA that extends along a direction parallel to the substrate 410 on which it is mounted (e.g., along the x-axis, as shown in FIGS. 1A, 1B, 1C, 1D, and 1E).

The folding optic 200 is located on the emission axis EA and is configured to redirect or reflect the beam of light emitted by the laser emitter 100 toward an optical axis OA of an optical element, such as a diffractive optical element (DOE), a light diffuser, or a refractive lens and may perform optical functions such as collimation and pattern generation. The optical axis OA extends in a direction that is non-parallel to the emission axis EA. For the sake of illustration, in FIGS. 1A, 1B, 1C, 1D, and 1E, the optical axis OA is substantially perpendicular to the emission axis and substantially perpendicular to the substrate 410 (e.g., extends along the z-axis or the "height" direction as shown in the figures), although, in some embodiments, the optical axis OA is not perpendicular to the emission axis EA. By folding the optical path of the beam emitted by the laser emitter 100, the thickness of the package along the optical axis (e.g., along the z direction as shown in FIGS. 1A, 1C, 1D, and 1E) is reduced.

A laser emitter 100 generally has a length along its emission axis EA that is significantly greater than its thickness along directions perpendicular to the emission axis. For example, a laser emitter may be several millimeters long along its emission axis. As such, arranging the laser emitter 100 in a direction non-parallel or perpendicular to the optical axis OA of the laser system 10 can reduce the overall thickness of the laser system along its optical axis OA.

The laser emitter 100 is spaced at a distance $d_x$ from the folding optic 200, as measured along the emission axis EA (e.g., along the x direction). The folding optic 200 is spaced at a distance $d_z$ from the optical element 300 along the optical axis OA (e.g., along the z direction or "height" direction).

The folding optic 200 is sized and arranged such that it reflects a substantial portion of the light emitted by the laser emitter. If the folding optic 200 is small, then a substantial portion of the light is not reflected, and the overall efficiency of the laser system may decrease because less light is emitted onto the external environment. On the other hand, due to the Gaussian shape of the beam emitted by the laser emitter 100, the additional amount of light captured at the edges of the beam quickly decreases with distance from the emission axis. In some embodiments, the folding optic 200 is configured to redirect (e.g., reflect) substantially the entire beam, where substantially the entire beam is defined, in one embodiment to be about 95% or more of the light emitted by the laser emitter 100 such that the laser system 10 can be operated with high efficiency. However, embodiments of the present invention are not limited thereto and, in some embodiments, the folding optic 200 may be configured to redirect at least 99% of the light emitted by the laser emitter.

In some embodiments, the laser emitter 100 is physically connected to the substrate 410 by a submount 420, which raises the laser emitter 100 such that the emission axis EA is directed to a particular location on the folding optic 200. The submount may be formed of a material having high thermal conductivity, such as a metal. The particular location may be chosen such that the folding optic 200 reflects substantially all of the light emitted by the laser emitter 100. Considerations for the sizing of the folding optic 200 and the spacing between the folding optic 200 and other components of the laser system 10 are described in more detail below.

The laser emitter 100 may be oriented with its active side (e.g., the side having the p-n junction) facing toward the submount 420 in order to reduce or minimize the thermal resistance between the active side (the junction) and the thermal pad of the submount 420 of the package. This allows for improved thermal conduction to the submount 420, and improves the cooling efficiency of the laser emitter compared to an orientation with the active side facing away from the submount 420, where the thickness of the substrate of the laser die can result in higher thermal resistance.

The package may include the substrate 410 and, as shown in FIG. 1E, an encapsulating portion 430. The substrate 410 and the encapsulating portion 430 may be formed of various types of materials, such as metal, plastic, glass, ceramic, and combinations thereof. The substrate portion 410 and the encapsulating portion 430 may be formed of various materials or compositions of materials. The encapsulating portion 430 may include a clear aperture 440, formed of an optically transparent material (e.g., transparent at least in the emission spectrum of the laser emitter 100) such as glass or a polycarbonate.

In some embodiments of the present invention, the laser emitter 100 and the folding optic 200 are included within the same package (e.g., between the substrate 410 and the encapsulating portion 430) without additional packaging material between the laser emitter 100 and the folding optic 200. For example, the laser emitter 100 may be included as a laser diode with appropriate contacts and without a protective transistor outline can (TO-Can) package located between the laser diode and the encapsulating portion 430. This allows the package to be sealed (e.g., hermetically sealed) for environmental resilience of the laser emitter 100.

Furthermore, in some embodiments of the present invention, an optical element is included within the package (e.g., between the substrate 410 and the encapsulating portion 430), again without additional packaging material between the laser emitter 100 and the optical element. As discussed above, the optical element may be a diffractive optical element (DOE), a light diffuser, a refractive lens, or combinations thereof (e.g., multiple refractive lenses or a combination of a DOE with a refractive lens). In some embodiments, an optical element may be used as the clear aperture 440 of the encapsulating portion (e.g., the clear aperture 440 may be a DOE).

As shown in FIGS. 1B and 1D, in some embodiments, the substrate 410 has an airflow port 412 that is placed adjacent the folding optic 200 in order to make a reflow soldering process for this package robust and free of potential contamination of the elements. Incorrect placement of the port within an optically active region of the substrate 410 would result in potential adsorption of solder or other reflowable chemical solutions used in the reflow-soldering process onto the surfaces of the folding optic 200. As such, in some embodiments of the present invention, the airflow port 412 is located outside of an optically active region of the substrate (e.g., between the laser emitter 100 and the folding optic 200) and, instead, located in an optically inactive region 414 of the substrate 410, outside of the path of the beam emitted by the laser emitter 100 toward the folding optic 200.

Figure 2:
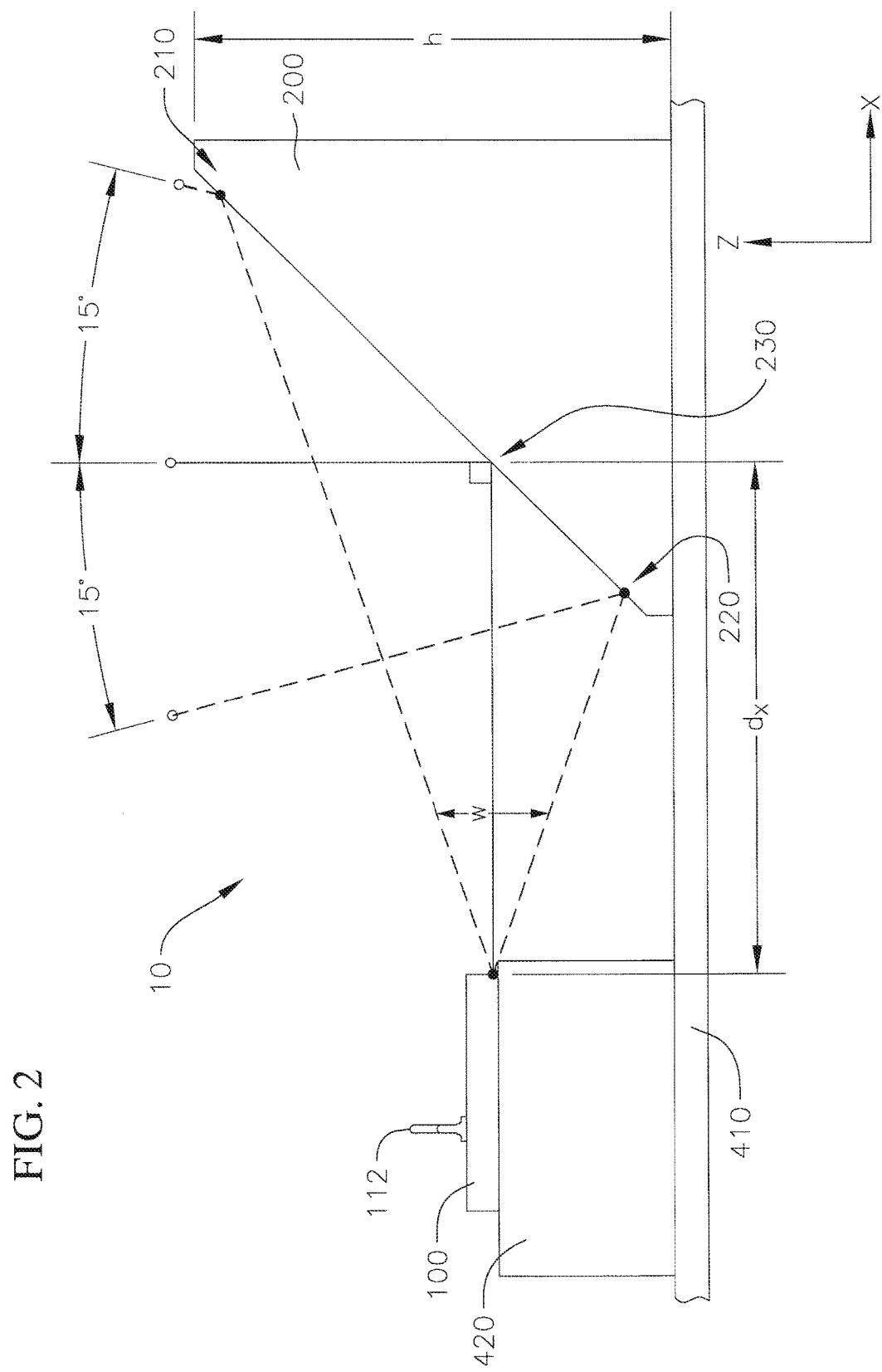
FIG. 2 is a cut-away side view of the laser system of the embodiment shown in FIG. 1A, further schematically illustrating the divergence of the laser beam and the location and size of the folding optic.

FIG. 2 is a cut-away side view of the laser system of the embodiment shown in FIG. 1A, and schematically illustrates the divergence of the laser beam and the location and size of the folding optic 200. In the embodiment of FIG. 2, the folding optic 200 is arranged at an angle of 45° with respect to the emission axis EA, such that the optical axis OA is perpendicular to the emission axis EA. A laser diode typically exhibits divergence in its beam, that is, an increase in the diameter or width w of the beam with distance from the optical aperture of the laser emitter 100. An edge-emitting diode laser may also typically have two different divergence rates along its "fast axis" (having higher divergence) and "slow axis" (having lower divergence). The solid line in FIG. 2 illustrates the path of light along the center of the beam, and the dashed lines illustrate paths of light at the edges of the beam (e.g., where 95% of the energy of the beam is located between the dashed lines). The width w of the beam (e.g., along the z direction, before striking the folding optic 200 or in the x direction, after striking the folding optic 200) increases with increasing distance from the optical aperture of the laser emitter 100.

As seen in FIG. 2, because the upper portion 210 of the folding optic 200 (e.g., the portion toward the emission direction of the laser system 10) is farther from the laser emitter 100 than the lower portion 220 of the folding optic 200 (e.g., the portion farther from the emission direction of the laser system 10), the beam divergence is greater where the beam interacts with the upper portion 210 than it is at the lower portion 220. As a result, the center of the beam may be directed to a particular location 230 below the center of the folding optic 200.

Therefore, when designing a laser system 10 including a folding optic 200, as the distance $d_x$ between the laser emitter 100 and the folding optic 200 increases, the size of the folding optic 200 increases (e.g., the height $h_m$ of the folding optic 200) in order to reflect substantially the entire beam emitted by the laser emitter 100.

FIGS. 3A, 3B, 3C, and 3D are schematic diagrams illustrating laser systems in two different arrangements of components.

Figure 3C:
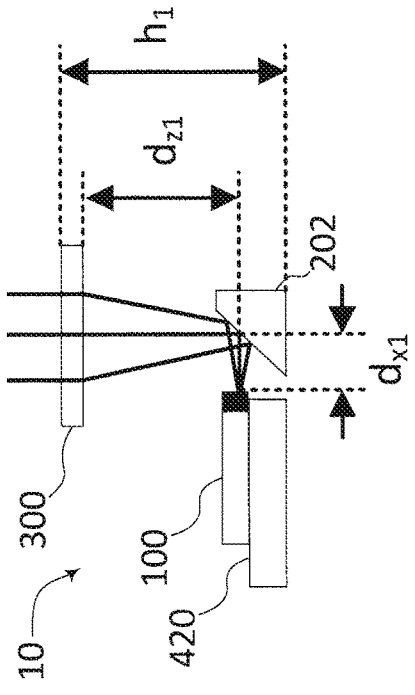
FIGS. 3A, 3B, 3C, and 3D are schematic diagrams illustrating laser systems having two different arrangements of components.
Figure 3D:
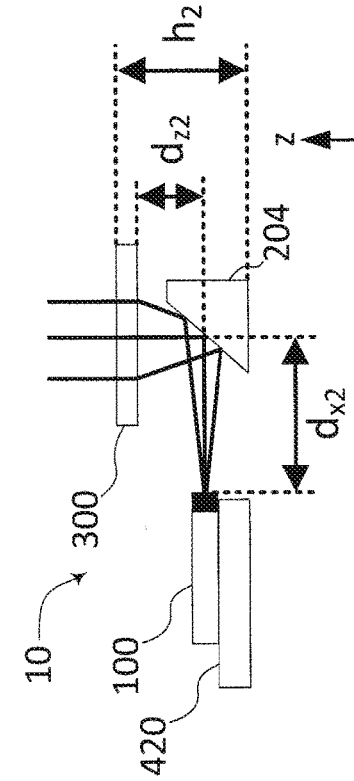
Figure 3A:
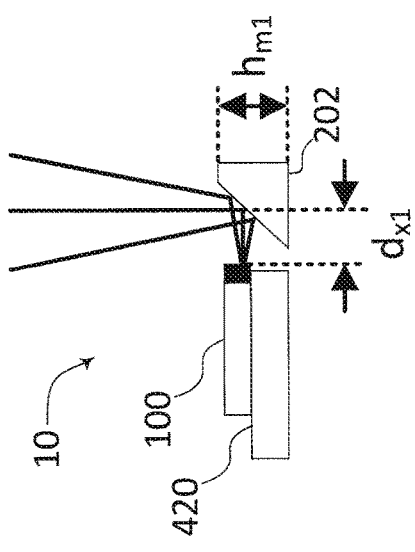

FIG. 3A illustrates a laser emitter 100 configured to emit light toward a first folding optic 202, which is at a distance $d_{x1}$ from the laser emitter 100. As discussed above, the height $h_{m1}$ of the first folding optic 202 that is sufficient to capture substantially the entire beam is based on the divergence of the beam and the distance $d_{x1}$. Because the beam width increases linearly with distance $d_x$, in order to reduce or minimize the height $h_{m1}$ of the first folding optic 202, the laser emitter 100 may be placed close to the first folding optic 202.

Figure 3B:
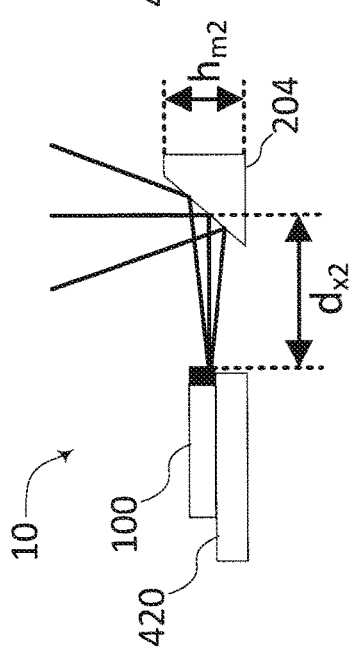

FIG. 3B illustrates another arrangement in which the laser emitter 100 is at a larger distance from the folding optic than in the arrangement of FIG. 3A. In particular, in FIG. 3B, the laser emitter 100 is at a distance $d_{x2}$ from the laser emitter 100, where $d_{x2}$ is greater than $d_{x1}$. Due to the increased distance, in FIG. 3B the beam is wider when it reaches the folding optic 204 than in the arrangement shown in FIG. 3A. as a result, the folding optic 204 of FIG. 3B has a larger height $h_{m2}$ than the folding optic 202 of FIG. 3A (e.g., $h_{m2} > h_{m1}$) in order to reflect the same portion of the beam.

A large mirror has a larger height (e.g., along the z direction) and therefore a larger mirror may increase the height of the laser system 10 or the height of the package in comparison to laser systems having smaller mirrors.

As such, one way to reduce the thickness of a laser system is to place the laser emitter 100 at a short distance $d_x$ from the folding optic 200 (e.g., to place the laser emitter 100 as close as possible to the folding optic 200) in order to reduce or minimize the height $h_m$ of the folding optic 200, thereby reducing the overall thickness of the device.

However, in many applications that use additional optical elements 300, such as collimation optics, light diffusers, and pattern generators, in order for the optical element 300 to perform properly, the optical element 300 is spaced from the light emitter 100 at a back focal length (BFL). The BFL of an optical element 300 depends on the particular characteristics of the optical element.

FIG. 3C is a schematic diagram of the laser system of FIG. 3A, where the laser emitter 100 is spaced at a short distance $d_{x1}$ from the folding optic 202. In order to space the laser emitter 100 from the optical element 300 at the BFL required by the optical element along the folded optical path of the beam, the optical element 300 is spaced at a distance $d_{z1}$ from the folding optic 202 along the optical axis (or the z direction). In this way, the beam travels along a first section of its optical path having length $d_{x1}$ before it reaches the folding optic 202, and the beam travels along a second section of its optical path having length $d_{z1}$ after being reflected off the folding optic 202 and before it reaches the optical element 300. The distances $d_{x1}$ and $d_{z1}$ are design such that their sum is equal to the back focal length of the optical element 300. (e.g., $d_{x1} + d_{z1} = BFL$, such that the total optical path includes both the x-distance $d_x$ and the z-distance $d_z$).

The height of the resulting laser system 10 therefore is not $h_{m1}$, but rather $h_1$, which takes into account the distance required to achieve the back focal length of the optical element 300. However, because the distance $d_{x1}$ of the embodiments of FIGS. 3A and 3C was chosen to reduce or minimize the height $h_{m1}$ of the folding optic 202, the length of the first portion $d_{x1}$ of the optical path to the optical element is generally very small, and the length of the second portion $d_{z1}$ of the optical path must be relatively large in order to satisfy the optical requirements, such as the back focal length, of the optical element 300.

FIG. 3D is a schematic diagram of the laser system of FIG. 3B, where the laser emitter 100 is spaced at a longer distance $d_{x2}$ from the folding optic 204. In this example, the same optical element 300 of FIG. 3C having the same back focal length (BFL) is used with the laser system shown in FIG. 3D. As before, in order to space the laser emitter 100 from the optical element 300 at the back focal length along the optical path of the beam, the optical element 300 is spaced at a distance $d_{z2}$ from the folding optic 204. However, because the laser emitter 100 is spaced at a longer distance $d_{x2}$ from the folding optic 204, a larger part of the back focal length is taken up in the first portion (or section) along the x direction, and therefore the second portion (or section) having length $d_{z2}$ along the z direction is smaller than the corresponding section $d_{z1}$ in the embodiment of FIG. 3C (in other words, $d_{z2} < d_{z1}$).

As a result, although the folding optic 204 of the embodiment of FIG. 3D has a greater height $h_{m2}$ than the height $h_{m1}$ of the folding optic 202 of the embodiment of FIG. 3C ($h_{m2} > h_{m1}$), the total height $h_2$ of the system 10 in FIG. 3D is smaller than the total height $h_1$ of the system 10 in FIG. 3C. In other words, increasing the distance $d_x$ between the laser emitter 100 and the folding optic 200 can reduce the overall height h of the system, including the optical element 300, due to a reduction length of the section of the folded optical path that is traveled along the z direction or thickness direction in order meet the back focal length demands of the optical element 300, despite an increase in the height $h_m$ of the folding optic 200 to reflect substantially the entire beam.

Comparative laser systems having folding optical paths are typically designed for general purpose use. As such, these general purpose laser systems are not tailored to reduce or minimize the overall height of the system, including any optical elements, because they are not designed with any particular optical elements in mind. Instead, when such when such general purpose laser systems that include only a laser emitter and a folding optic are designed to minimize thickness, the distance $d_x$ is reduced or minimized (because doing so minimizes the height $h_m$ of the mirror, as discussed above). Such laser systems are generally sealed in a package that is substantially unmodifiable (e.g., because opening the package would damage the components within or destroy the device), and therefore the distance $d_x$ between the laser emitter and the folding optic in such comparative laser systems are fixed at their short distances.

On the other hand, embodiments of the present invention relate to laser systems in which the height of the entire system, including the optical element 300, is reduced or minimized by taking into consideration the optical characteristics, such as the back focal length, of the optical element 300. In particular, designing a system to reduce or minimize overall height depends on the divergence of the beam and the back focal length of the optical element 300. In particular, the $1/e^2$ beam divergence $\Theta$ and any placement tolerances introduced during manufacturing are taken into account. The goal of the numeric optimizer is to minimize the overall height h of the system, subject to the constraints that the optical characteristics of the optical element 300 are satisfied (e.g., that the optical element 300 are in focus by satisfying the back focal length), that the laser beam is not noticeably or significantly clipped when redirected by the folding optic (e.g., by redirecting at least or about 99% of the beam), and that there is sufficient mechanical clearance between the various parts (e.g., the mirror and the optics).

Figure 4:
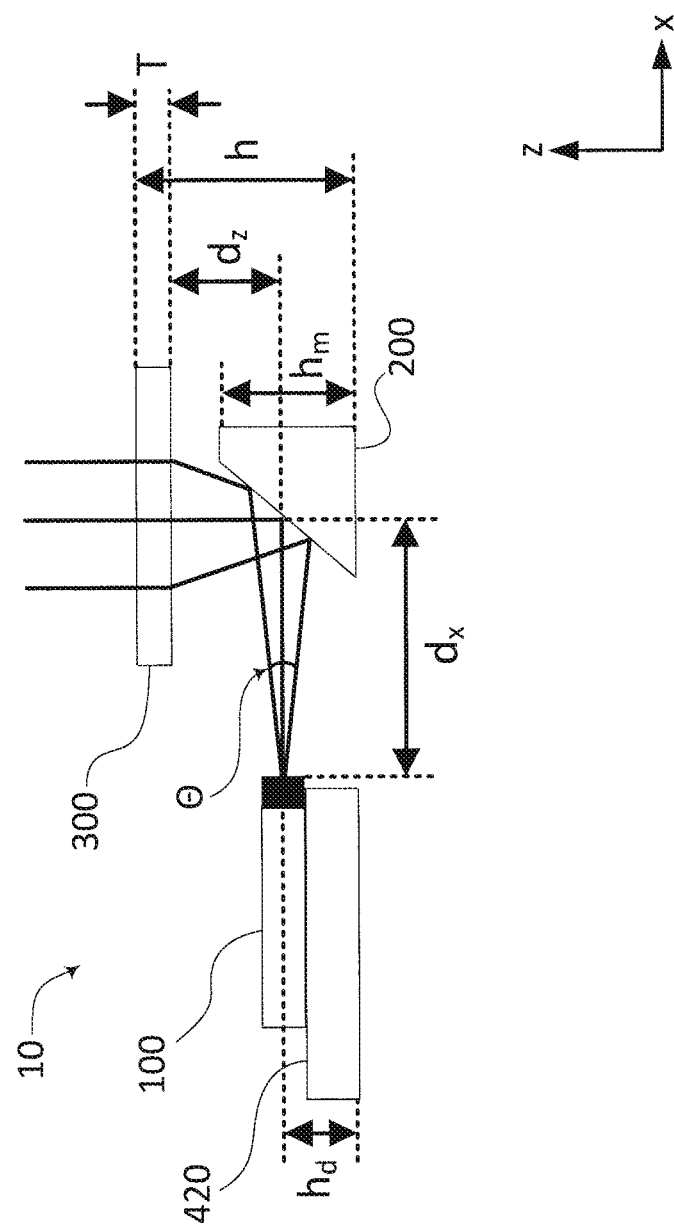
FIG. 4 is a schematic diagram of a laser system according to one embodiment of the present invention.

FIG. 4 is a schematic diagram of a laser system according to one embodiment of the present invention. FIG. 4 is substantially similar to FIG. 3D, but further includes additional labels of components, including the divergence $\Theta$ of the laser diode along the z direction (e.g., in some embodiments, the fast axis divergence angle), the height $h_d$ of the emission point of the laser emitter, and the thickness T of the optical element 300 (e.g., the thickness of an optical system including one or more optical components).

According to one embodiment of the present invention, the height h can be defined as the sum of the height $h_d$ of the emission point of the laser emitter, the length of the second portion $d_z$ of the optical path, and the thickness T of the optical element 300 ($h=h_d+d_z+T$) (the thickness of the substrate 410 is substantially independent of the thickness requirements imposed by the laser emitter 100 and the optical element 300). As noted above, the optimization is subject to a number of constraints.

One constraint is ensuring that the optical element 300 is in focus by setting the lengths of the optical path to be equal to the back focal length of the optical element (e.g., that $d_x+d_z=BFL$).

Another constraint is mechanical clearance between the folding optic 200 and the optical element 300. In other words, the length $d_z$ of the second section of the optical path is greater than the height $h_m$ of the folding optic 200, less the height $h_d$ of the laser emitter (e.g., $d_z-(h_m-h_d)>0$).

A third constraint is avoiding or reducing clipping of the beam, in other words, providing a sufficiently large mirror to redirect substantially all of the beam, such as 99% of the beam. In one embodiment, this constraint is satisfied, approximately, when:

$$h_d+1/2w(d_x)<h_m$$

and $$h_m-1/2w(d_x)>0$$

where $w(l)$ is the $1/e^2$ beam waist of a laser spot at a propagation distance l from the emission point (e.g., $w(l)=2\cdot l\cdot\tan(\Theta/2)$).

In another embodiment, the third constraint can be solved more precisely by adjusting for differences in the propagation distance due to the 45 degree angle of the folding optic 200 by instead using the constraints:

$$h_d+1/2w_u<h_m$$

$$h_m+1/2w_b>0$$

where $w_u$ and $w_b$ are recursively defined as:

$$w_u\text{:solve } w = \sqrt{\frac{\lambda R}{\pi}}\sqrt{1+\left(\frac{w+d_x}{R}\right)^2}$$

$$w_b\text{:solve } w = -\sqrt{\frac{\lambda R}{\pi}}\sqrt{1+\left(\frac{w+d_x}{R}\right)^2}$$

where R is the laser diode Rayleigh range.

In the constraints above, the back focal length BFL, the laser diode Rayleigh range R, and the divergence $\Theta$ are constants that depend on characteristics of the optical element 300 and the laser emitter 100 that are used in the laser system 10. As such, the distance $d_x$ between the emission point of the laser emitter 100 and the folding optic 200 that minimizes the height h based on the constraints can be approximated as a function of the back focal length BFL and the divergence $\Theta$, or calculated more precisely as a function of the back focal length BFL, the divergence $\Theta$, and the Rayleigh range R.

Generally, the overall height h of the laser system 10 is not minimized at the limit where $d_x$ is increased to the point that the optical element 300 meets or contacts the folding optic 200 (e.g., where $d_z$ is minimized), because the height $h_m$ of the mirror may need to increase rapidly due to a high angle of divergence $\Theta$ of the beam.

As such, the arrangement and size of components of the laser system inside the package, in particular, the size of the folding optic 200, the placement of the emission point of the laser emitter 100, and the positioning of the emission axis EA within the package are designed or optimized for reduced or minimal package height when used in conjunction with a particular optical element 300, such as a diffractive optical element or a combination of components, such as a refractive lens in combination with a diffractive optical element.

In one embodiment of a laser system 10 configured as a pattern projection module, the total thickness of the package is less than 3 mm. The thickness refers to the dimension that typically adds thickness to the design of a device such as a smartphone that incorporates the projection module. In some such embodiments, the divergence $\Theta$ of the beam emitted by the laser emitter 100 is in the range of 16 degrees to 20 degrees, the back focal length of the optical element 300 is in the range of 3 mm to 5 mm, and the spacing $d_x$ between the laser emitter 100 and the folding optic 200 is in the range of 0.5 mm to 3 mm. In one embodiment of this system, the overall horizontal length (e.g., along the x direction) of the module is less than 7 mm. In one embodiment of this system, the horizontal length of the system (e.g., along the x direction) is close to the back focal length of the optical element that shapes light such as an optical lens, or an optical element that diffuses light or projects a light pattern, such as a diffractive optical element (DOE). Examples of diffractive optical elements for pattern generation are described, for example, in U.S. patent application Ser. No. 14/743,742 "3D DEPTH SENSOR AND PROJECTION SYSTEM AND METHODS OF OPERATING THEREOF" filed in the United States Patent and Trademark Office on Jun. 18, 2015 and in U.S. Pat. No. 9,503,708, the entire disclosures of which are incorporated by reference.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An optical projection system comprising:
   a laser emitter configured to emit a beam of light along an emission axis, the beam having a divergence;
   an optical element having an optical axis, the optical axis being non-parallel to the emission axis, the optical element having a back focal length; and
   a folding optic configured to redirect the beam emitted by the laser emitter toward the optical axis of the optical element, the beam following a folded optical path having:
      a first section extending along the emission axis from the laser emitter to the folding optic; and
      a second section extending along the optical axis from the folding optic to the optical element,
      the sum of the lengths of the first and second sections being equal to the back focal length,
      the length of the first section being a function of the divergence of the beam and the back focal length of the optical element, the function being designed to reduce the height of the folding optic, and
      the folding optic having a height along the optical axis configured to redirect substantially the entire beam emitted by the laser emitter.

2. The optical projection system of claim 1, wherein a thickness of the optical projection system along the optical axis is independent of optical characteristics of the optical element.

3. The optical projection system of claim 2, wherein the thickness of the optical projection system is less than 3 mm.

4. The optical projection system of claim 3, wherein the divergence is in a range of 16 degrees to 20 degrees, and wherein the back focal length is in a range of 3 mm to 5 mm.

5. The optical projection system of claim 1, wherein the laser emitter is mounted on a submount, the submount raising a height of laser emitter along a direction of the optical axis, and
   wherein an active area of the laser emitter faces the submount.

6. The optical projection system of claim 1, wherein the emission axis is perpendicular to the optical axis.

7. The optical projection system of claim 1, wherein the folding optic is a mirror.

8. The optical projection system of claim 1, wherein the folding optic is a prism.

9. The optical projection system of claim 1, wherein the optical element comprises a diffractive optical element.

10. The optical projection system of claim 9, wherein the diffractive optical element is configured to perform a collimation function.

11. The optical projection system of claim 9, wherein the diffractive optical element is configured to perform a collimation function and a patterning function.

12. The optical projection system of claim 1, wherein the optical element comprises a light diffuser.

13. The optical projection system of claim 1, wherein the optical element comprises a refractive lens.

14. The optical projection system of claim 1, wherein the laser emitter and the folding optic are mounted on a substrate, the substrate having an airflow port in an optically inactive region of the substrate.

15. An optical projection system configured to emit light along an optical axis toward an optical element at a configured location, the optical element having a back focal length and being aligned with the optical axis, the optical projection system comprising:
   a laser emitter configured to emit a beam of light along an emission axis, the beam having a divergence; the emission axis being non-parallel to the optical axis; and
   a folding optic configured to redirect the beam emitted by the laser emitter toward the optical axis,
   the optical projection system being configured to transmit the beam along a folded optical path having:
      a first section extending along the emission axis from the laser emitter to the folding optic; and
      a second section extending along the optical axis from the folding optic to the configured location of the optical element,
      the sum of the lengths of the first and second sections being equal to the back focal length,
      the length of the first section being a function of the divergence of the beam and the back focal length of the optical element, the function being designed to reduce the height of the folding optic, and
      the folding optic having a height along the optical axis configured to redirect substantially the entire beam emitted by the laser emitter.

16. The optical projection system of claim 15, wherein a thickness of the optical projection system along the optical axis, from the folding optic to the configured location, is independent of optical characteristics of the optical element.

17. The optical projection system of claim 16, wherein the thickness of the optical projection system, from the folding optic to the configured location, is less than 3 mm.

18. The optical projection system of claim 17, wherein the divergence is in a range of 16 degrees to 20 degrees, and wherein the back focal length is in a range of 3 mm to 5 mm.

19. The optical projection system of claim 15, wherein the optical element comprises a diffractive optical element.

20. The optical projection system of claim 19, wherein the diffractive optical element is configured to perform a collimation function.

* * * * *